United States Patent
Dave et al.

[19]

[11] Patent Number: 6,110,220
[45] Date of Patent: Aug. 29, 2000

[54] CONCURRENT HARDWARE-SOFTWARE CO-SYNTHESIS OF HARD REAL-TIME APERIODIC AND PERIODIC SPECIFICATIONS OF EMBEDDED SYSTEM ARCHITECTURES

[75] Inventors: Bharat P. Dave, Howell; Niraj K. Jha, Princeton, both of N.J.

[73] Assignee: Lucent Technologies Inc., Murray Hill, N.J.

[21] Appl. No.: 09/024,839

[22] Filed: Feb. 17, 1998

Related U.S. Application Data

[60] Provisional application No. 60/038,488, Feb. 24, 1997, provisional application No. 60/038,934, Feb. 24, 1997, and provisional application No. 60/054,709, Aug. 4, 1997.

[51] Int. Cl.$^7$ .................................................... G06F 17/50
[52] U.S. Cl. .......................... 716/3; 716/2; 716/4; 716/7; 716/8; 709/102; 709/103; 709/104; 709/105; 709/106
[58] Field of Search ..................................... 395/500, 706, 395/500.02; 709/102, 103, 104, 105, 106

[56] References Cited

U.S. PATENT DOCUMENTS

| | | | |
|---|---|---|---|
| 4,885,684 | 12/1989 | Austin et al. | 395/706 |
| 5,202,987 | 4/1993 | Bayer et al. | 709/102 |
| 5,210,872 | 5/1993 | Ferguson et al. | 709/102 |
| 5,418,953 | 5/1995 | Hunt et al. | 709/102 |
| 5,452,461 | 9/1995 | Umekita et al. | 395/706 |
| 5,590,323 | 12/1996 | Kartalopoulos | 709/106 |
| 5,742,821 | 4/1998 | Prasanna | 709/102 |
| 5,768,594 | 6/1998 | Blelloch et al. | 395/706 |
| 5,781,787 | 7/1998 | Shafer et al. | 712/28 |
| 5,870,588 | 2/1999 | Rompaey et al. | |

OTHER PUBLICATIONS

Srinivasan et al, "Hardware–Software Co–Synthesis of Fault–Tolerant Real–Time Distributed Embedded Systems", IEEE Proceedings of the 1995 European Design Automation Conference EURO–DAC '95, pp. 334–339, Sep. 1995.

Hamidzadeh et al, "Dynamic Scheduling of Real–Time Aperiodic Tasks on Multiprocessor Architectures", IEEE Proceedings of the 29th Hawaii International Conference on System Sciences, pp. 469–478, Jan. 1996.

(List continued on next page.)

*Primary Examiner*—Kevin J. Teska
*Assistant Examiner*—Samuel Broda

[57] ABSTRACT

Hardware-software co-synthesis of an embedded system requires mapping of its specifications into hardware and software modules such that its real-time and other constraints are met. Embedded system specifications are generally represented by acyclic task graphs. Many embedded system applications are characterized by aperiodic as well as periodic task graphs. Aperiodic task graphs can arrive for execution at any time and their resource requirements vary depending on how their constituent tasks and edges are allocated. Traditional approaches based on a fixed architecture coupled with slack stealing and/or on-line determination of how to serve aperiodic task graphs are not suitable for embedded systems with hard real-time constraints, since they cannot guarantee that such constraints would always be met. The present invention addresses the problem of concurrent co-synthesis of aperiodic and periodic specifications of embedded systems. The algorithm estimates the resource requirements of aperiodic task graphs and allocates execution slots on processing elements and communication links for executing them. The present approach guarantees that the deadlines of both aperiodic and periodic task graphs are always met. Simultaneous consideration of aperiodic task graphs while performing co-synthesis of periodic task graphs is vital for achieving superior results compared to the traditional slack stealing and dynamic scheduling approaches. This is the first co-synthesis algorithm that provides simultaneous support of periodic and aperiodic task graphs with hard real-time constraints. Application of the proposed algorithm to several examples from real-life telecom transport systems shows that up to 28% and 34% system cost savings are possible over co-synthesis algorithms which employ slack stealing and rate-monotonic scheduling, respectively.

14 Claims, 5 Drawing Sheets

OTHER PUBLICATIONS

Dave et al, "CASPER: Concurrent Hardware–software Co–Synthesis of Hard Real–Time Aperiodic and Periodic Specifications of Embedded System Architectures", IEEE Proceedings of Design, Automation, and Test in Europe 1998, pp. 118–124, Feb. 1998.

"A Global Criticality/Local Phase Driven Algorithm for the Constrained Hardware/Software Partitioning Problem", by Asawaree Kalavade and Edward A. Lee; 1994 IEEE, pp. 42–48.

"Algorithms for Scheduling Hard Aperiodic Tasks in Fixed–Priority Systems using Slack Stealing", by Sandra R. Thuel and John P. Lehoczky, 1994 IEEE, pp. 22–33.

"Allocation of Periodic Task Modules with Precedence and Deadline Constraints in Distributed Real–Time Systems",by Chao–Ju Hou and Kang G. Shin, 1992 IEEE Computer Society Technical Committee on Real–Time Systems, 11 pages.

"An Efficient Algorithm for Graph Isomorphism", by D.G. Corneil and C.C. Gotlieb, Journal of the Association for Computing Machinery, vol. 17, No. 1, Jan. 1970, pp. 51–64.

"An Optimal Algorithm for Scheduling Soft–Aperiodic Tasks in Fixed–Priority Preemptive Systems", by John P. Lehoczky and Sandra Ramos–Thuel, 1992 IEEE Computer Society Technical Committee on Real–Time Systems, 15 pages.

"Aperiodic Servers in a Deadline Scheduling Environment", by T.M. Ghazalie and T.P. Baker; Realtime Systems 9, (1995), pp. 31–67.

"Architectural Support For Designing Fault–Tolerant Open Distributed Systems", by Salim Hariri, Alok Choudhary, and Behcet Sarikaya, 1992 IEEE.

"Calculating the Maximum Execution Time of Real–Time Programs", by P. Puschner and C.H. Koza, The Journal of Real–Time Systems, 1,(1989), pp. 159–176.

"Communication Synthesis for Distributed Embedded Systems", by Ti–Yen Yen and Wayne Wolf, Proceedings of International Conference on Computer–Aided Design, pp. 288–294, Nov. 1995.

"Computer–Aided Hardware–Software Codesign", by Giovanni De Micheli, Aug. 1994 IEEE Micro Chips, Systems, Software, and Applications, 8 pages.

"Configuration–Level Hardware/Software Partitioning for Real–Time Embedded Systems", by Joseph G. D'Ambrosio and Xiaobo (Sharon) Hu, 1994 IEEE, pp. 34–41.

"Constrained Software Generation for Hardware–Software Systems", by Rajesh K. Gupta and Giovanni De Micheli, 1994 IEEE, pp. 56–63.

"Dynamic Critical–Path Scheduling: An Effective Technique for Allocating Task Graphs to Multiprocessors", by Yu–Kwong Kwok, Ishfaq Ahmad, IEEE Transactions on Parallel and Distributed Systems, vol. 7, No. 5, May 1996, 17 pages.

"Efficient Scheduling Algorithms for Real–Time Multiprocessor Systems", by Krithi Ramamritham, John A. Stankovic, and Perng–Fei Shiah, IEEE Transactions on Parallel and Distributed, vol. 1, No. 2, Apr. 1990, 12 pages.

"Exploiting Unused Periodic Time for Aperiodic Service Using the Extended Priority Exchange Algorithm", by Brinkley Sprunt, John Lehoczky, and Lui Sha, IEEE Computer Society Real–Time Systems Symposium, Dec. 6–8, 1988, pp. 251–258.

"Hardware–Software Co–Design of Embedded Systems", by Wayne H. Wolf, Proceedings of the IEEE, vol. 82, No. 8, Jul. 1994, pp. 967–989.

"A Hardware–Software Codesign Methodology for DSP Applications", by Asawaree Kalavade and Edward A. Lee, Sep. 1993 IEEE Design & Test of Computers, pp. 16–28.

"Hardware–Software Cosynthesis for Digital Systems", by Rajesh K. Gupta and Giovanni De Micheli, Sep. 1993, IEEE Design & Test of Computers, pp. 29–40.

A Hardware/Software Partitioner Using a Dynamically Determined Granularity, by Jörg Henkel and Rolf Ernst, DAC 97—Jun. 1997 Anaheim, CA, 3 pages.

"Hill–Climbing Heuristics for Optical Hardware Dimensioning and Software Allocation in Fault–Tolerant Distributed Systems", by Fausto Distant and Vincenzo Piuri, IEEE Transactions on Reliability, vol. 38, No. 1, Apr. 1989, pp. 28–39.

"Load Sharing with Consideration of Future Task Arrivals in Heterogeneous Distributed Real–Time Systems", by Chao–Ju Hou and Kang G. Shin, 1991 IEEE Real–Time Computer Laboratory, pp. 94–103.

"Low Overhead Fault Tolerance for Real–Time Distributed Systems: Application to Hardware/Software Co–Synthesis of Embedded Systems", by Santhanam Srinivasan and Niraj K. Jha, 31 pages, corresponding to conference paper presented Sep. 1995 in Proc. European Design Automation Conf.

"On–Line Scheduling of Hard Deadline Aperiodic Tasks in Fixed–Priority Systems", by Sandra Ramos–Thuel and John P. Lehoczky, 1993 IEEE, pp. 160–171.

"On–Line Scheduling of Real–Time Tasks", by Kwang S. Hong and Joseph Y.–T. Leung, 1988 IEEE Computer Society, pp. 244–250.

On the Complexity of Fixed–Priority Scheduling of Periodic, Real–Time Tasks, by Joseph Y.–T. Leung and Jennifer Whitehead, 1982 North–Holland Publishing Company, Performance Evaluation 2 (1982), pp. 237–250.

"On Non–Preemptive Scheduling of Periodic and Sporadic Tasks", by Kevin Jeffay, Donald F. Stanat, and Charles U. Martel, Dec. 1991 IEEE Twelfth Real–Time Systems Symposium, pp. 129–139.

Optimal Algorithms for Synthesis of Reliable Application–Specific Heterogeneous Multiprocessors, by Aurobindo Dasgupta and Ramesh Karri, IEEE Transactions on Reliability, vol. 44, No. 4, Dec. 1995, pp. 603–613.

"Optimal Priority Assignment for Aperiodic Tasks With Firm Deadlines in Fixed Priority Pre–Emptive Systems", by Robert Davis and Alan Burns, Information Processing Letters, vol. 53, No. 5, Mar. 1995, pp. 249–254.

"Performance Estimation for Real–Time Distributed Embedded Systems", by Ti–Yen Yen and Wayne Wolf, Dept. of Electrical Engineering, Princeton University, pp. 1–6, Proc. of Intl. Conf. on Computer Design, Oct. 1995.

"Process Partitioning for Distributed Embedded Systems", by Junwei Hou and Wayne Wolf, Sep. 1996 IEEE, pp. 70–75.

"Program Implementation Schemes for Hardware–Software Systems", by Rajesh K. Gupta, Claudionor N. Coelho Jr., and Giovanni De Micheli, Jan. 1994 IEEE, vol. 27, No. 1, pp. 48–55.

"Rate–Monotonic Analysis for Real–Time Industrial Computing", by Mark H. Klein et al., Jan. 1994, vol. 27, No. 1, pp. 24–33.

"Replication and Allocation of Task Modules in Distributed Real–Time Systems", by Chao–Ju Hou and Kang G. Shin, Jun. 1994, IEEE Computer Society, pp. 26–35.

"Scheduling Algorithms and Operating Systems Support for Real–Time Systems", by Krithi Ramamritham and John A. Stankovic, Proceedings of the IEEE, vol. 82, No. 1, Jan. 1994, pp. 55–67.

"Scheduling Parallel I/O Operations in Multiple Bus Systems", by Ravi Jain et al., Journal of Parallel and Distributed Computing 16, 1992, pp. 352–362.

"Scheduling Periodically Occurring Tasks on Multiple Processors", by Eugene L. Lawler and Charles U. Martel, Information Processing Letters, vol. 12, No. 1, Feb. 1981.

"Scheduling Slack Time in Fixed Priority Pre–emptive Systems", by R.I. Davis, K.W. Tindell, and A. Burns, Dec. 1993 IEEE Real–Time Systems Symposium, pp. 222–231.

"Scheduling Tasks with Resource Requirement in Hard Real–Time Systems", by Wei Zhao et al., IEEE Transactions on Software Engineering, vol. SE–13, No. 5, May 1987, pp. 564–577.

"Sensitivity–Driven Co–Synthesis of Distributed Embedded Systems", by Ti–Yen and Wayne Wolf, International Symposium on System Synthesis, 1995, pp. 1–6.

"SIERA: A Unified Framework for Rapid–Prototyping of System–Level Hardware and Software", by Mani B. Srivastava and Robert W. Brodersen, IEEE Transactions on Computer–Aided Design of Integrated Circuits and Systems, vol. 14, No. 6, Jun. 1995, pp. 676–693.

"SOS: Synthesis of Application–Specific Heterogeneous Multiprocessor Systems", by Shiv Prakash and Alice C. Parker, Journal of Parallel and Distributed Computing, vol. 16, No. 4, pp. 338–351 (1992).

"SpecCharts: A VHDL Front–End for Embedded Systems", by Frank Vahid, Sanjiv Narayan, and Daniel D. Gajski, IEEE Transactions on Computer–Aided Design of Integrated Circuits and Systems, vol. 14, No. 6, Jun. 1995, pp. 694–706.

"Synthesis of Application Specific Instruction Sets", Ing–Jer Huang and Alvin M. Despain, IEEE Transactions of Computer–Aided Design of Integrated Circuits and Systems, vol. 14, No. 6, Jun. 1995, pp. 663–675.

"System–Level Synthesis of Low–Power Hard Real–Time Systems", by Darko Kirovski and Miodrag Potkonjak, DAC97, Jun. 1997, Anaheim, CA, 6 pages.

"Task Allocation for Maximizing Reliability of Distributed Computer Systems", by Sol M. Shatz, Jia–Ping Wang, and Masanori Goto, IEEE Transactions on Computers, vol. 41, No. 9, Sep. 1992, pp. 1156–1160.

"TBFT: A Task–Based Fault Tolerance Scheme for Distributed Systems", by Shalini Yajnik, Santhanam Srinivasan, Niraj K. Jha, Seventh International Conference on Parallel and Distributed Computing Systems, Oct. 1994, 21 pages.

"TigerSwitch: A Case Study in Embedded Computing System Design", by Wayne Wolf, Andrew Wolfe, Steve Chinatti, Ravi Koshy, Gary Slater, and Spencer Sun, 0–8186–6315—Apr. 1994, 1994 IEEE, pp. 89–96.

"Dynamic Scheduling of Real–Time Aperiodic Tasks on Multiprocessor Architectures," by Babak Hamidzadeh and Yacine Atif, 1996 IEEE, Proceedings of the 29th Annual Hawaii International Conference on System Sciences, pgs.

"Hardware–Software Co–Synthesis of Fault–Tolerant Real–Time Distributed Embedded Systems," by Santhanam Srinivasan and Niraj K. Jha, 1995 IEEE, Design Automation Conference 1995, with EURO–VHDL, Proceedings EURO–DAC '95, European.

"An Approach to the Adaptation of Estimated Cost Parameters in the COSYMA System," by D. Hermann et al., Proceedings of Third International Workshop on Hardware/Software CoDesign, 1994, pp. 100–107.

"Architectural Partitioning for System Level Synthesis of Ingtegrated Circuits," by E. Lagnese et al., IEEE Computer Aided Design of Integrated Circuits and Systems, 1991, pp. 847–860.

"CoWare–A Design Environment for Hetergeneous Hardware/Software Systems Systems," by Van Rompaey et al., Design Automation Conference, 1996, pp. 252–257.

"Fast Timing Analysis for Hardware–Software Co–Synthesis, " by R. Ernst et al., VLSI in Computers and Processors, 1993, pp. 452–457.

"Hardware–Software Cosynthesis," by R. Ernst et al., IEEE Design & Test of Computers, Dec. 1993, pp. 64–75.

"Synthesis and Anaylsis of an Industrial Embredded Microcontroller,"by Ing–Jer Huang et al., Design Automation Conference, 1997, pp. 151–156.

dl (t3) = dl (t7) = 125
γ = 500 est=0
dl (t11) =80
dl (t12) =60
period=100

$\pi_1 = 1$     $\pi_2 = 2$
est = 0     $\gamma_2 = 8$
period = 10     $dl = 8$
dl = 5

0  1  2  4  6  8  10
| t1 | t2 | t2 |

FIG. 3A
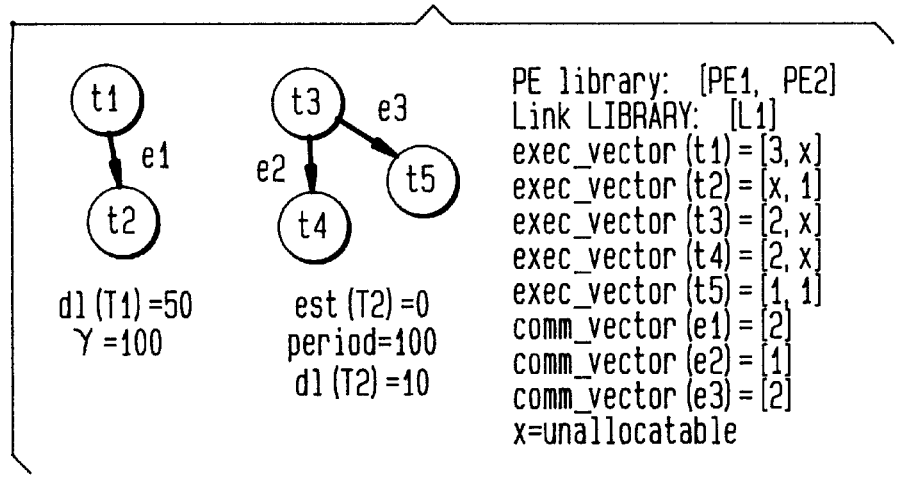
d1 (T1) =50
γ =100
est (T2) =0
period=100
d1 (T2) =10
PE library: [PE1, PE2]
Link LIBRARY: [L1]
exec_vector (t1) = [3, x]
exec_vector (t2) = [x, 1]
exec_vector (t3) = [2, x]
exec_vector (t4) = [2, x]
exec_vector (t5) = [1, 1]
comm_vector (e1) = [2]
comm_vector (e2) = [1]
comm_vector (e3) = [2]
x=unallocatable
FIG. 3B
t1, t3, t4, t5
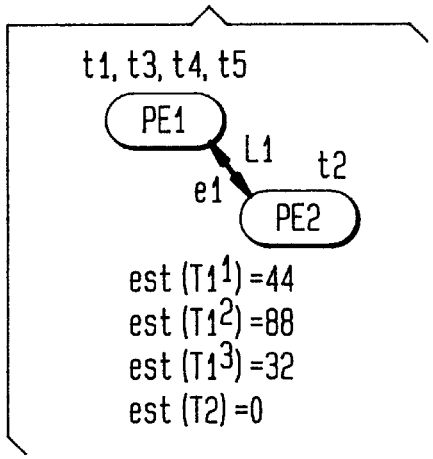
est $(T1^1)$ =44
est $(T1^2)$ =88
est $(T1^3)$ =32
est (T2) =0
FIG. 3C
| PE1 | {t3, 0, 2}, {t4, 2, 4}, {t5, 4, 5}<br>{$t1^1$, 32, 35}, {$t1^2$, 44, 47}, {$t1^3$, 88, 91} |
|-----|---|
| L1  | {$e1^1$, 35, 37}, {$e1^2$, 47, 49}, {$e1^3$, 91, 93} |
| PE2 | {$t2^1$, 37, 38}, {$t2^2$, 49, 50}, {$t2^3$, 93, 94} |
exec_slot= (task (edge), start_time, finish_time)

d1=90, γ =30

PE library= [PE1, PE2]  Link library= [L1]
exec_vector (t1) = [20, 40] comm_vector (e1) =25
exec_vector (t2) = [10, 30] comm_vector (e2) =10
exec_vector (t3) = [x, 25] comm_vector (e3) =10
exec_vector (t4) = [15, x]

TABLE 1: EXPERIMENTAL RESULTS FOR TELECOM TRANSPORT SYSTEM EXAMPLES

| EXAMPLE (NO. OF TASKS) | CASPER WITH SLACK STEALING | | | CASPER WITH RMS | | | | CASPER | | | | |
|---|---|---|---|---|---|---|---|---|---|---|---|---|
| | NO. OF PEs | NO. OF LINKS | CPU TIME (sec.) | COST ($) | NO. OF PEs | NO. OF LINKS | CPU TIME (sec.) | COST ($) | NO. OF PEs | NO. OF LINKS | CPU TIME (sec.) | COST ($) | COST SAVINGS OVER SLACK STEALING % | COST SAVINGS OVER RMS % |
| CATS1/(112) | 4 | 2 | 106.2 | 665 | 5 | 3 | 117.5 | 725 | 3 | 2 | 94.6 | 520 | 21.8 | 28.3 |
| CATS2/(178) | 7 | 4 | 187.1 | 1504 | 8 | 5 | 211.4 | 1635 | 5 | 3 | 136.2 | 1135 | 24.5 | 30.6 |
| CATS3/(324) | 10 | 4 | 1619.7 | 1965 | 12 | 5 | 1880.5 | 2355 | 8 | 4 | 1400.1 | 1580 | 19.6 | 32.9 |
| CHAS1/(539) | 15 | 11 | 1938.5 | 1945 | 14 | 11 | 2014.6 | 1830 | 12 | 10 | 1720.5 | 1460 | 24.9 | 20.2 |
| CHAS2/(712) | 22 | 9 | 4940.1 | 9080 | 24 | 10 | 5160.2 | 10865 | 18 | 7 | 4218.1 | 7128 | 21.5 | 34.4 |
| CHAS3/(848) | 19 | 9 | 7195.3 | 8070 | 22 | 11 | 7610.6 | 9150 | 15 | 6 | 5890.6 | 6560 | 18.7 | 28.3 |
| CHAS4/(1018) | 37 | 14 | 19956.3 | 13930 | 39 | 16 | 21060.7 | 14910 | 29 | 8 | 16928.3 | 9980 | 28.4 | 33.1 |
| CHAR5/(1241) | 46 | 16 | 20390.2 | 16780 | 45 | 15 | 19830.1 | 17610 | 34 | 10 | 17140.2 | 12820 | 23.6 | 27.2 |

CONCURRENT HARDWARE-SOFTWARE CO-SYNTHESIS OF HARD REAL-TIME APERIODIC AND PERIODIC SPECIFICATIONS OF EMBEDDED SYSTEM ARCHITECTURES

CROSS-REFERENCES TO RELATED APPLICATIONS

This nonprovisional U.S. national application, filed under 35 U.S.C. § 111(a), claims, under 35 U.S.C. § 119(e)(1), the benefit of the filing dates of (1) provisional U.S. national application No. 60/038,488, filed under 35 U.S.C. § 111(b) on Feb. 24, 1997; (2) provisional U.S. national application No. 60/038,934, filed under 35 U.S.C. § 111(b) on Feb. 24, 1997; and (3) provisional U.S. national application No. 60/054,709, filed under 35 U.S.C. § 111(b) on Aug. 4, 1997, the teachings of all three of which are incorporated herein by reference.

This application is one of the set of U.S. patent applications consisting of Ser. Nos. 09/024,604; 09/024,605; 09/025,537; 09/024,839; 09/025,097; and 09/024,762, all of which share the same filing date and the teachings of all of which are incorporated herein by reference.

BACKGROUND OF THE INVENTION

1. Field of the Invention

The present invention relates to the design of real-time distributed embedded systems, and, in particular, to the process of partitioning an embedded system specification into hardware and software modules using hardware-software co-synthesis.

2. Description of the Related Art

Many embedded systems employ heterogeneous distributed architectures on which a large number of tasks are run concurrently. Such architectures consist of several general-purpose processors and application-specific integrated circuits (ASICs) of different types interconnected by various communication links. Each of the embedded system tasks can be performed by a number of hardware and software platforms which have different dollar costs. For example: 1) a telecom protocol handling function can be implemented on a general-purpose processor (software) or an ASIC (hardware), 2) an information packet (control or communication data) can be transferred via a point-to-point link, bus, or a local area network (LAN). Each option has varying delay, area, and power requirements. Architecture definition of an embedded system requires simultaneous synthesis of the hardware and software architectures which is usually referred to as hardware-software co-synthesis.

Finding an optimal hardware-software architecture entails selection of processors, ASICs, and communication links such that the cost of the architecture is minimum and all real-time constraints are met. Hardware-software co-synthesis involves various steps such as allocation, scheduling, and performance estimation. The allocation step determines the mapping of tasks to processing elements (PEs) and inter-task communications to communication links. The scheduling step determines the sequencing of tasks mapped to a PE and sequencing of communications on a link. The performance estimation step estimates the finish time of each task and determines the overall quality of the architecture in terms of its dollar cost, ability to meet its real-time constraints, power consumption, and fault tolerance, etc. Both allocation and scheduling are known to be NP-complete. See Reference (1). Therefore, optimal co-synthesis is computationally a very hard problem.

Many embedded systems are characterized by both aperiodic and periodic tasks. Examples of such systems are: flight control systems, telecom systems, command and control systems, process control systems, automobile control systems, space shuttle avionics systems, and defense control systems. Periodic tasks arrive at regular intervals. Aperiodic tasks have random arrival times. Periodic task graphs generally have hard real-time constraints, whereas aperiodic task graphs can have either hard or soft real-time constraints. Many researchers have addressed co-synthesis of periodic task graphs. Also, there exists a large amount of literature on scheduling of aperiodic tasks for a given architecture which either minimizes the probability of failure to complete an aperiodic task by its hard deadline or minimizes its response time.

Hardware-Software Co-Synthesis

Researchers have primarily focused their interest in the last several years on hardware-software partitioning, a major sub-problem in co-synthesis (see References (3)–(11)) where target embedded systems have one-CPU-one-ASIC architectures. In these approaches: 1) attempts have been made to move operations from hardware to software or vice versa to minimize cost and meet deadlines, and 2) the issue of fine-grain and coarse-grain granularity has been addressed during partitioning of embedded system specifications. Co-design frameworks for co-specification and co-simulation have been described in References (12)–(19) where hardware/software partitioning is performed manually. These systems provide an integrated environment to manage both hardware and software in co-design projects. In the area of distributed system co-synthesis, the target architecture can employ multiple processors, ASICs, and field-programmable gate arrays (FPGAs). See Reference (20). Two distinct approaches have been used to solve the distributed system co-synthesis problem: optimal and heuristic. In the optimal domain, the approaches are: 1) mixed integer linear programming (MILP) (see Reference (21)), and 2) exhaustive. See Reference (22). These are applicable to only small co-synthesis problem instances. There are two distinct approaches in the heuristic domain: 1) iterative (see References (23)–(24)), and 2) constructive. See References (2) and (25)–(26).

None of the above co-synthesis algorithms support co-synthesis of aperiodic task graphs with hard real-time constraints which are found in many embedded systems.

Scheduling Techniques for Aperiodic Tasks

There is a vast amount of literature in the area of scheduling of soft and hard aperiodic tasks (see References (27)–(40)) for a given architecture. A survey of scheduling techniques is provided in Reference (27). These techniques address only scheduling, and not co-synthesis. There are two possible approaches for scheduling of aperiodic tasks: 1) static scheduling where the schedule is defined a priori, and 2) dynamic (also referred to as "on-line") where the decision regarding execution of aperiodic tasks is made on-line. Static scheduling is generally used for periodic task graphs. In case of aperiodic tasks, though static scheduling requires some up front knowledge of the tasks, it has less computational overhead. Aperiodic task graphs can be soft or hard. Soft aperiodic task graphs do not have fixed deadlines. Algorithms proposed for scheduling aperiodic tasks in References (28)–(40) are based on the dynamic scheduling paradigm. These approaches either minimize the probability of not meeting the deadline during allocation of tasks on a given architecture or minimize the response times. Although a dynamic approach does not require prior knowledge of task characteristics, it suffers from the following inherent disadvantages: 1) it incurs a computational overhead in determining the most suitable PE to allocate an aperiodic task to, such that the aperiodic task deadline can be met, 2) it incurs an additional delay in transferring the aperiodic task to another PE in the event a deadline cannot be shown to be met for the aperiodic task on the PE it first arrived at, and 3) it cannot give a guarantee that deadlines will always be met. In References (28)–(34), techniques are presented to handle dynamic scheduling of soft and hard aperiodic tasks for uniprocessor systems based on the concept of slack stealing from the existing schedule of periodic tasks. Their limitations are: 1) they ignore precedence among tasks, i.e. the inter-task communications, and 2) they cannot handle simultaneous scheduling of aperiodic and periodic tasks. In References (35)–(38), dynamic scheduling of aperiodic tasks is considered for homogeneous multiprocessor systems. However, these techniques too do not take inter-task communication into consideration. In Reference (39), dynamic scheduling of aperiodic task graphs with precedence constraints is considered, however, inter-task communication scheduling is ignored and the target architecture is restricted to a set of homogenous processors. In Reference (40), deadline assignment for tasks of an aperiodic task graph is considered for dynamic scheduling. Both static and dynamic approaches can employ either preemptive or non-preemptive scheduling. Though a preemptive scheduler may provide efficient schedules and utilization of resources, non-preemptive scheduling algorithms are sometimes preferred for the following reasons: 1) in many practical real-time I/O systems, properties of hardware and software either make preemption prohibitively expensive or impossible, and 2) the overhead associated with a preemptive algorithm is more difficult to characterize and predict than that of a non-preemptive algorithm.

The problem of scheduling hard real-time aperiodic task graphs without the above-mentioned restrictive assumptions has not been considered for distributed heterogeneous systems.

SUMMARY OF THE INVENTION

The present invention is directed to the problem of concurrent co-synthesis of aperiodic and periodic task graphs with hard real-time constraints. The problem of co-synthesis of aperiodic task graphs is a difficult one since such task graphs arrive for execution at any time and their resource requirements vary depending on how each constituent task and edge is allocated. To solve this problem, the algorithm estimates the size of execution slots and allocates them on PEs and links of the architecture to which constituent tasks and edges are allocated such that the deadlines are always met. It is important to simultaneously consider aperiodic task graphs while performing co-synthesis of periodic task graphs to obtain an efficient architecture. The proposed techniques have been incorporated into the existing co-synthesis system, COSYN (see Reference (2)), and the resulting system is called CASPER (Co-synthesis of Aperiodic SPecification of Embedded system architectures). There appears to be no other scheduling (sub-problem of co-synthesis) or co-synthesis algorithm that guarantees that the deadlines of aperiodic task graphs with hard real-time constraints will always be met. The efficacy of the present deadline-based scheduling technique is established with respect to two traditional techniques: slack stealing and rate monotonic scheduling (RMS) via experimental results.

In one embodiment, the present invention is a method for designing the architecture of an embedded system, comprising a pre-processing phase and a synthesis phase. The pre-processing phase comprises the step of parsing one or more aperiodic task graphs, one or more system/task constraints, and a resource library for the embedded system. The synthesis phase, following the pre-processing phase, comprises the step of allocating one or more groups of one or more tasks in the aperiodic task graphs to one or more processing elements in the resource library and allocating one or more edges in the aperiodic tasks graphs to one or more communication links in the resource library, based on performance evaluation of one or more possible allocations for each of the groups and edges in light of the system/task constraints.

BRIEF DESCRIPTION OF THE DRAWINGS

Other aspects, features, and advantages of the present invention will become more fully apparent from the following detailed description, the appended claims, and the accompanying drawings in which:

FIGS. 3($a$)–($c$) show exemplary scheduling of aperiodic and periodic task graphs with inter-task communication;

Figure 1A:
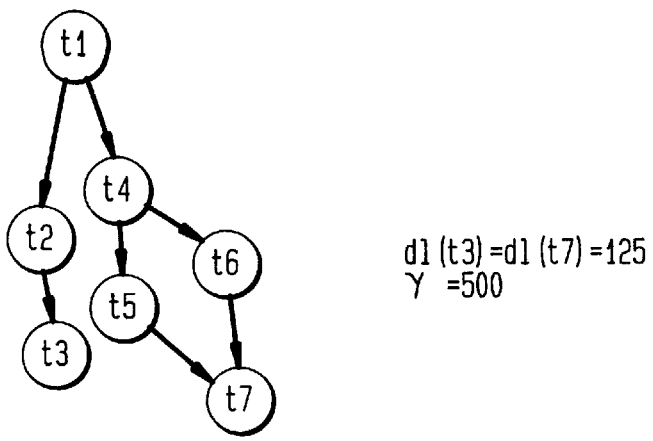
FIGS. 1($a$)–($b$) show exemplary aperiodic and periodic task graphs.

Table 1 shows experimental results for telecom transport systems.

DETAILED DESCRIPTION

1 CASPER

In one embodiment, the present invention is directed to a co-synthesis algorithm, called CASPER, employing a static scheduling method for both hard real-time aperiodic and periodic task graphs without the restrictive assumptions made by previous co-synthesis and scheduling techniques. Co-synthesis of aperiodic and periodic task graphs is simultaneously performed. The scheduling technique employs a combination of preemptive and non-preemptive scheduling approaches to provide efficient schedules. The algorithm guarantees that deadlines of hard real-time aperiodic and periodic task graphs are always met. It allows multiple types and forms of PEs and communication links, and supports both concurrent and sequential modes of communication and computation. It employs the concept of association array (see Reference (2)) to tackle the problem of multi-rate tasks. It supports task graphs where different tasks have different deadlines. It also supports pipelining of task graphs. The accuracy of its finish-time estimation step is enhanced by employing a deadline-based scheduling technique. Experimental results establish its efficacy over the traditional slack stealing and RMS-based approaches. See References (41)–(42).

2 The Co-Synthesis Framework

This section describes the architecture model, resource library, execution model, task graph parameters, and scheduling techniques which form the co-synthesis framework.

2.1 The Architecture Model

The present co-synthesis system does not use a pre-determined (fixed) architectural template, since such an approach can result in an expensive architecture and may not be suitable for a variety of embedded systems. In the present co-synthesis system, the resulting embedded system can have a heterogeneous distributed architecture employing different types of PEs and links, where the architectural topology is not determined a priori.

2.2 The Resource Library

Embedded system specifications are mapped to elements of a resource library, which consists of a PE library and a link library.

The PE library consists of various types of FPGAs, ASICs, and general-purpose processors. Each FPGA is characterized by: 1) the number of gates/flip-flops/programmable functional units (PFUs), 2) the boot memory requirement, 3) the number of pins, etc. Generally, all logic blocks of programmable devices such as FPGAs and programmable logic devices (PLDs) are not usable due to routing restrictions. A very high utilization of PFUs and pins may force the router to route the nets in such a way that it may violate the delay constraint, i.e. the worst-case execution times defined by the execution time vector (defined in Section 2.3) may be exceeded. In order to address this aspect, the algorithm uses only 70% of the available PFUs and 80% of the available pins for mapping tasks/edges to FPGAs and PLDs during synthesis. These percentages were derived based on existing designs and experimentally verified to guarantee the meeting of delay constraints during co-synthesis. Each ASIC is characterized by: 1) the number of gates, and 2) the number of pins. Each general-purpose processor is characterized by: 1) the memory hierarchy information, 2) communication processor/port characteristics, 3) the context switch time, etc.

The link library consists of various types of links such as point-to-point, bus, LAN. Each link is characterized by: 1) the maximum number of ports it can support, 2) an access time vector that indicates link access times for different number of ports on the link, 3) the number of information bytes per packet, 4) packet transmission time, etc.

2.3 The Execution Model

Figure 1B:
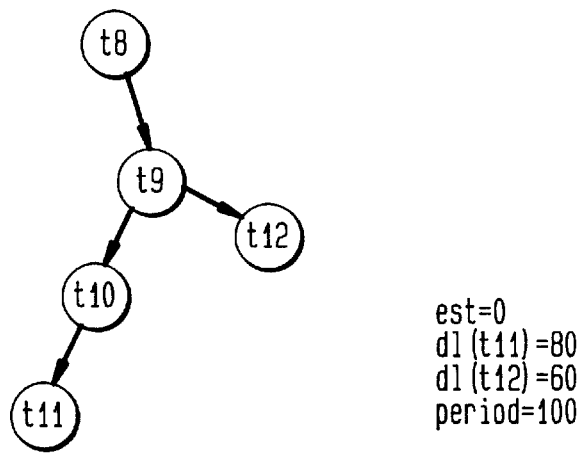

Each application-specific function executed by an embedded system is made up of several sequential and/or concurrent jobs. Each job is made up of several tasks. Tasks are atomic units performed by embedded systems. A task contains both data and control flow information. The embedded system functionality is usually described through a set of acyclic task graphs. Nodes of a task graph represent tasks. Tasks communicate data to each other, indicated by a directed edge. Task graphs can be periodic or aperiodic as shown in FIG. 1. Each periodic task graph has an earliest start time (est), period, and deadline (dl). Each task of a periodic task graph inherits the task graph's period. Each task in a periodic task graph can have a different deadline. Hard aperiodic task graphs have a specified deadline which must be met. Aperiodic task graphs are characterized by a parameter, $\gamma$, denoting the minimum time interval between two consecutive instances of an aperiodic task graph. An aperiodic task graph may start at any time.

Parameters used to characterize task graphs are described next. Each task is characterized by:

1. Execution time vector: This indicates the worst-case execution time of a task on the PEs in the PE library.

2. Preference vector: This indicates preferential mapping of a task on various PEs (such PEs may have special resources for the task).

3. Exclusion vector: This specifies which pairs of tasks cannot co-exist on the same PE (such pairs may create processing bottlenecks).

4. Memory vector: This indicates the different types of storage requirements for the task: program storage, data storage, and stack storage.

A cluster of tasks is a group of tasks which are always allocated to the same PE. Clustering of tasks in a task graph reduces the communication times and significantly speeds up the co-synthesis process. Each cluster is characterized by the preference and exclusion vectors of its constituent tasks.

Each edge in the task graphs is characterized by:

1. The number of information bytes that need to be transferred.

2. Communication vector: This indicates the communication time for that edge on various links from the link library. It is computed based on link characteristics.

The communication vector for each edge is computed a priori. At the beginning of co-synthesis, since the actual number of ports on the links is not known, the algorithm uses an average number of ports (specified beforehand) to determine the communication vector. This vector is recomputed after each allocation, considering the actual number of ports on the link.

In order to provide flexibility for the communication mechanism, the algorithm supports two modes of communication: 1) sequential, where communication and computation cannot go on simultaneously, and 2) concurrent, where communication and computation can go on simultaneously if supported by the associated communication link and PEs.

2.4 Scheduling

The algorithm uses a static scheduler that employs a combination of preemptive and non-preemptive scheduling to derive efficient schedules. Tasks and edges are scheduled based on deadline-based priority levels (see Section 4.4). The schedule for real-time periodic and aperiodic task graphs is defined during architecture synthesis.

3 Co-Synthesis of Aperiodic Task Graphs

This section discusses the problem of co-synthesis of hard real-time aperiodic task graphs, associated challenges, and techniques to address those challenges.

3.1 Problem Description and Challenges

The co-synthesis problem of periodic task graphs has been addressed in the literature before. However, an embedded system architecture must be capable of executing periodic and aperiodic task graphs concurrently such that the real-time constraints of all task graphs are met. Co-synthesis of aperiodic task graphs offers the following additional challenge: Aperiodic task graphs can arrive at the embedded system for execution at any time. Therefore, the architecture must have sufficient resources available at the required time to meet the deadline. This means that the resource requirements of such task graphs must be considered during architecture synthesis.

The above problem is formulated as an execution slot allocation problem. Execution slots are allocated to aperiodic task graphs similar to periodic task graphs on the architecture being synthesized such that their deadlines can always be met. There are two possible approaches for execution slot allocation: 1) determine the architecture based on periodic task graphs, follow up with execution slot allocation for aperiodic task graphs on the given architecture, and upgrade the architecture until all constraints of both periodic and aperiodic task graphs are met, or 2) determine the architecture by simultaneously considering periodic and aperiodic task graphs. The present invention uses the latter approach since simultaneous consideration of periodic and aperiodic task graphs results in very efficient architectures. This is demonstrated by experimental results. Another challenge is as follows. Aperiodic task graphs can have more than one task and communication edge. Tasks (edges) can potentially be mapped to a variety of PEs (links) since the architecture and allocation are not known beforehand. Therefore, one cannot exactly determine the length of the execution slot required from the start to finish of an aperiodic task graph. For example, as shown in the aperiodic task graph of FIG. 1(a), there are several paths from the source node (t1) to the sink nodes (t3, t7). The length of each path (in terms of the execution and communication time) varies depending on the mapping of constituent tasks and edges, since there are numerous allocation possibilities for each task and edge.

The above problem is viewed as an execution slot size estimation problem. The following sections describe the techniques for solving the above two problems.

3.2 Execution Slot Size Estimation

Allocation of periodic and aperiodic tasks is done simultaneously during the inner loop of the co-synthesis algorithm (see Section 4.3). The algorithm executes the aperiodic tasks at the next available execution slot. The hyperperiod of the system is computed as the least common multiple (LCM) of the periods of the various periodic task graphs in the specification. According to traditional real-time computing theory, a set of periodic task graphs has a feasible schedule if and only if it is schedulable in the hyperperiod. See Reference (43). The algorithm positions execution time slots for aperiodic task graphs throughout the hyperperiod, $\Gamma$, such that the real-time constraints of both periodic and aperiodic task graphs are met irrespective of when the aperiodic task graph arrives for execution. Such a task graph can have one or more tasks. Since the architecture is not known a priori, the length, $\mu$, of the execution time slot needs to be determined up front in order to properly position these slots throughout the hyperperiod. The algorithm allows the user to specify $\mu$ based on his/her experience from existing designs or system specifications. If $\mu$ is not specified a priori, the following procedure is used to determine its value.

Let an aperiodic task graph $T_j$ have m tasks, deadline $dl_j$ (relative to est of the task graph), minimum inter-instance time interval $\gamma_j$, and let there be n PEs in the resource library. $\pi_{is}$ represents the execution time of task i on PE s. The algorithm forms clusters of tasks in $T_j$ (using the method given in Section 4.2) and sets the communication times of all intra-cluster communication edges to zero (this is based on the traditional assumption made in distributed computing that intra-PE communication takes zero time). The algorithm obtains the length of the longest path, $\Im$, in the clustered task graph using the maximum execution and communication times (from the corresponding execution/communication time vectors) for the associated tasks and edges, respectively. If the value of $\Im$ is greater than $dl_j$, the algorithm sets its value equal to the length of the longest path which is less than or equal to $dl_j$. Next, the algorithm determines $\Theta$ and $\mu$ as follows (if task i is not allocatable to PE k based on an indication in the preference vector, then $\pi_{ik}$ is set equal to zero to derive $\Theta$).

$$S_k = \sum_{i=1}^{m} \pi_{ik} \quad (1)$$

$$S_k = 0 \text{ if } S_k > dl_j \text{ or } \pi_{ik} = 0 \quad (2)$$

$$\Theta = \max(S_1, S_2, S_3, \ldots, S_n) \quad (3)$$

$$\mu = \max(\Im, \Theta) \quad (4)$$

$S_k$ represents the total time taken to execute task graph $T_j$ on PE k assuming all tasks in $T_j$ are allocated to PE k. If $S_k > dl_j$, then PE k cannot be chosen for allocating tasks from $T_j$ since the deadline cannot be met. For this case, $S_k$ is made zero so that PE k does not play a role in computing $\Theta$ and $\mu$. If even one task of $T_j$ cannot be allocated to PE k (based on the preference vector), then again PE k cannot be considered further. Thus, $S_k$ is made zero for this case, too. $\Theta$ represents the execution time of $T_j$ on the PE on which it takes the most time to execute, while still ensuring that the deadline of $T_j$ is met (usually such a PE would be the cheapest among the feasible PEs). $\Im$ represents the schedule length of $T_j$ when not all of its tasks are allocated to the same PE. Note that different task clusters in $T_j$ could potentially get allocated to different PEs and such PEs would be connected with various links. However, the schedule length for $T_j$ cannot be allowed to exceed $dl_j$. Based on the above discussion, $\mu$ can be seen to be a large enough time interval to allow the co-synthesis algorithm to find a feasible single-PE or distributed architecture for $T_j$ so that its deadline is guaranteed to be met. $\mu$ is used to determine the est of each aperiodic task graph instance, as shown in the next section.

3.3 Execution Slot Allocation

This section shows how time slots of length $\mu$ can be distributed in the hyperperiod to tackle the aperiodic task graph no matter when it arrives. The minimum number of time slots in the hyperperiod required to tackle aperiodic task graph $T_j$ with deadline $dl_j$ is equal to $\phi = \lceil \Gamma \div (dl_j - \mu) \rceil$. The minimum inter-instance time interval, $\gamma$, of $T_j$ is assumed to be greater than or equal to $dl_j$ for the time being for simplicity of exposition. When $\gamma < dl_j$, the concept of task graph pipelining is employed (this is explained in Section 4.1). The allocated time slot has the form $\{y, z\}$, where y and z indicate its start and finish times, respectively. If the time slot is not available at the desired instant, more execution time slots than $\phi$ may be needed. The first slot is positioned, assuming est=0, at $\{dl_j - \mu, dl_j\}$. Then, successive slots are positioned at $\{i(dl_j - \mu), i(dl_j) - (i-1)\mu\}$ throughout the hyperperiod $\Gamma$, where i=2, 3, ..., $\phi$. If the last required slot $\{r, s\}$ exceeds $\Gamma$, then a time slot is allocated at $\{r - \Gamma, s - \Gamma\}$ at the beginning of the hyperperiod. If the execution time slot is not available at the desired instant, say $\{w, z\}$, but is available earlier at $\{p, q\}$, then the algorithm allocates the execution time slot at $\{p, q\}$ and successive slots at $\{ip, ip+\mu\}$, as before.

Figure 2A:
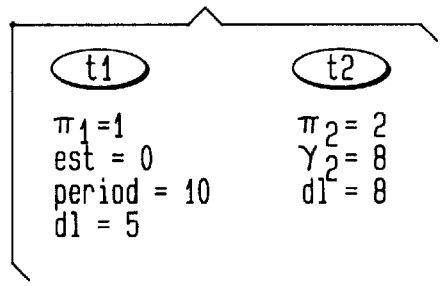
FIGS. 2($a$)–($b$) show exemplary periodic and aperiodic task graph scheduling.
Figure 2B:
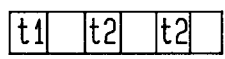

Consider the task graphs in FIG. 2(a), where t1 is periodic and t2 is aperiodic. For simplicity, assume that there is only one task in each graph. $\pi_1$ and $\pi_2$ are the corresponding execution times on the sole PE in the resource library. Assume that both t1 and t2 are allocated to the same PE. The hyperperiod is 10. Since the aperiodic task graph has only one task, $\mu$ is equal to its worst-case execution time, which is equal to 2. The deadline of t2 is equal to 8. Therefore, the number of execution time slots required by t2 in the hyperperiod is $\lceil 10 \div (8-2) \rceil = 2$. The first execution time slot is required at $\{6, 8\}$. The second execution time slot is required at $\{12, 14\}$, which exceeds the hyperperiod. Thus, this slot is converted to $\{12-10, 14-10\} = \{2, 4\}$. Since this slot is available, it is allocated in the hyperperiod, as shown in FIG. 2(b). Allocation of these two slots in the hyperperiod for t2 guarantees that the deadline of t2 is always met, irrespective of its arrival time, as long as two successive instances of t2 are separated by 2. If t2 arrives before or at instant 2, it will be served by slot $\{2, 4\}$. If it arrives after instant 2 and before or at instant 6, it will be served by slot $\{6, 8\}$. Similarly, if it arrives after instant 6 and before or at instant 12, it will be served by the first slot of the next hyperperiod, and so on.

Next, consider the more complex example shown in FIG. 3(a). The specification consists of an aperiodic task graph T1 and a periodic task graph T2. Suppose that the PE library consists of two PEs and the link library consists of a single link. The execution (communication) times of the different tasks (edges) on members of the PE (link) library are also shown in FIG. 3(a). Since there is only one periodic task graph, its period is equal to the hyperperiod. Thus, Γ=100. Suppose, for simplicity, that no task clustering is done. From the equations in Section 3.2, μ can be seen to be equal to 6. Therefore, φ=⌈100÷(50−6)⌉=3. Let the three instances of T1 be labeled $T1^1$, $T1^2$, and $T1^3$. The constituent tasks of T1 are similarly labeled. The execution slots for the aperiodic task graph are allocated at {44, 50}, {88, 94} and {132–100, 138–100}={32, 38 }. FIG. 3(b)shows a feasible architecture along with its task and edge allocation. FIG. 3(c) shows the PE/link schedule for this architecture.

4 The CASPER Algorithm

Figure 4:
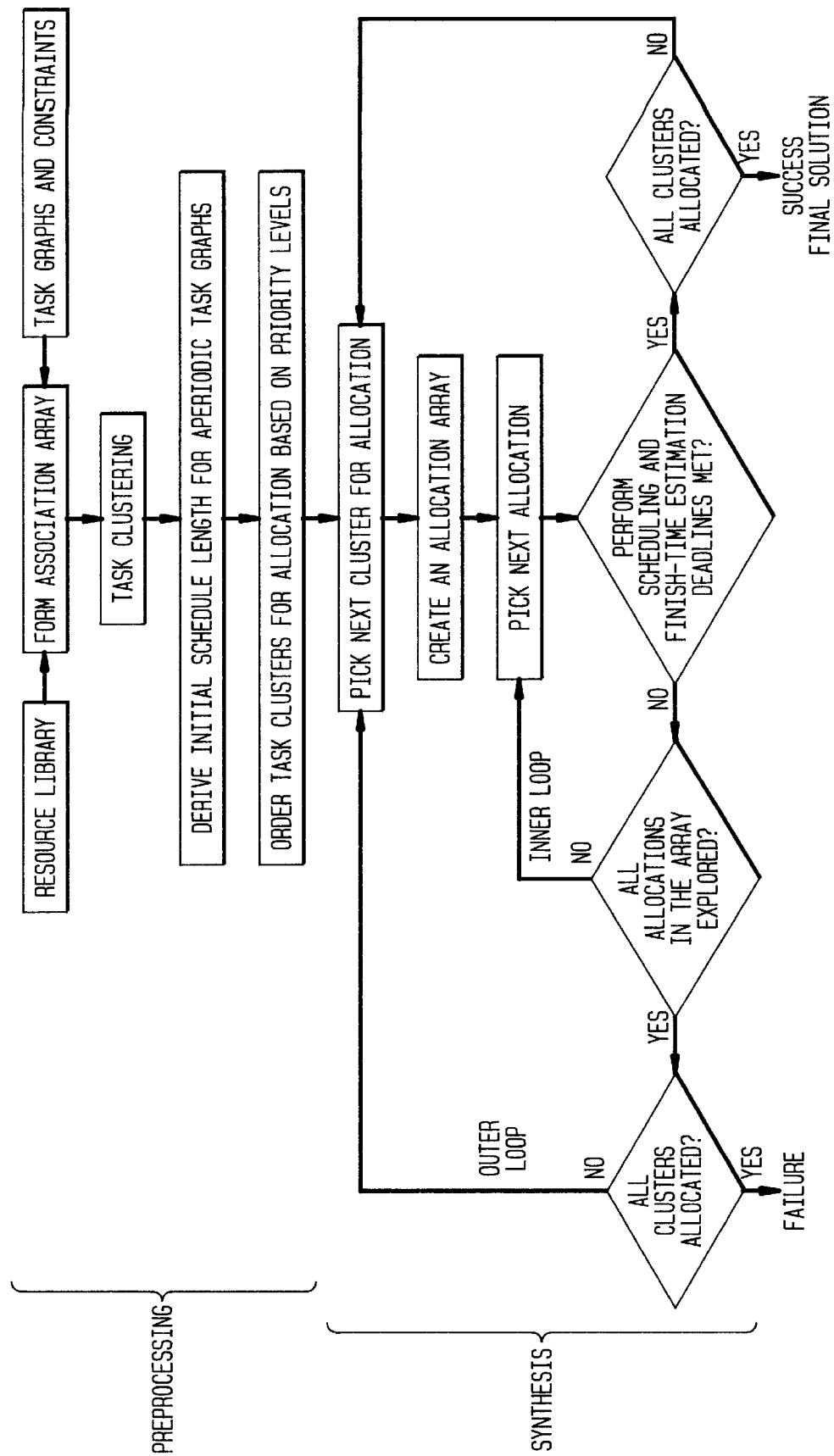
FIG. 4 shows the co-synthesis process flow, according to one embodiment of the present invention.

This section provides an overview of CASPER. FIG. 4 presents one possible co-synthesis process flow for the present invention. This flow is divided up into two parts: pre-processing and synthesis. During pre-processing, the algorithm processes the task graph, system constraints, and resource library, and creates necessary data structures. In traditional real-time computing theory, if $period_i$ is the period of task graph i then {hyperperiod÷period} copies are obtained for it. See Reference (43). However, this is impractical from both co-synthesis CPU time and memory requirements point of view, especially for multi-rate task graphs where this ratio may be very large. This problem is addressed by using the concept of association array. See Reference (2). The clustering step involves grouping of tasks to reduce the search space for the allocation step. See Reference (44). Tasks in a cluster get mapped to the same PE. This significantly reduces the overall complexity of the co-synthesis algorithm since allocation is part of its inner loop. At this point, an initial schedule length is derived for the aperiodic task graphs. Then clusters are ordered based on their importance/priority.

The synthesis step determines the allocation for both periodic and aperiodic task graphs. The synthesis part has two loops: 1) an outer loop for allocating each cluster, and 2) an inner loop for evaluating various allocations for each cluster. For each cluster, an allocation array consisting of the possible allocations at that step is created. While allocating a cluster to a hardware module such as an ASIC or FPGA, it is made sure that the module capacity related to pin count, gate count, etc., is not exceeded. Similarly, while allocating a cluster to a general-purpose processor, it is made sure that the memory capacity of the PE is not exceeded. Inter-cluster edges are allocated to resources from the link library.

The next step is scheduling which determines the relative ordering of tasks/edges for execution and the start and finish times for each task and edge. The algorithm employs a combination of both preemptive and non-preemptive static scheduling. Preemptive scheduling is used in restricted scenarios to minimize scheduling complexity (see Section 4.4). For task preemption, the algorithm takes into consideration the operating system overheads such as interrupt overhead, context-switch, remote procedure call (RPC) etc. through a parameter called preemption overhead (this information is experimentally determined and provided a priori). Incorporating scheduling into the inner loop facilitates accurate performance evaluation. Performance evaluation of an allocation is extremely important in picking the best allocation. An important step of performance evaluation is finish-time estimation. In this step, with the help of the scheduler, the finish times of each task and edge are estimated using the longest path algorithm. See Reference (2). After finish-time estimation, it is verified whether the given deadlines in the task graphs are met. The allocation evaluation step compares the current allocation against previous ones based on total dollar cost of the architecture.

4.1 The Association Array

Traditionally, as mentioned before, each task graph is replicated the requisite number of times in the hyperperiod. This is the approach used in the co-synthesis algorithms in References (24)–(25). The present algorithm uses the concept of association array (see Reference (2)) to eliminate the need for replication of task graphs in the hyperperiod. An association array contains limited information about each copy of the task graph. Experience from COSYN (see Reference (2)) shows that up to 8-fold reduction in co-synthesis CPU time is possible for medium-sized task graphs (with tasks numbering in the hundreds) with less than 1% increase in system cost. It not only eliminates the need to replicate task graphs, but it also allows allocation of different task graph copies to different PEs, if desirable, to derive an efficient architecture. This array is created after task cluster formation and is updated after scheduling. It also supports pipelining of task graphs. This is explained next.

There are two types of task graphs: 1) those with a deadline less than or equal to the period, and 2) those with a deadline greater than the period. In order to address this fact, the association array can have two dimensions. If a task graph has a deadline less than or equal to its period, it implies that there will be only one instance of the task graph in execution at any instant. Such a task graph needs only one dimension in the association array, called the horizontal dimension. If a task graph has a period less than its deadline, it implies that there can be more than one instance of this task graph in execution at some instant, e.g., MPEG frame processing. For such tasks, a two-dimensional association array is created, where the vertical dimension corresponds to concurrent execution of different instances of the task graph. For aperiodic task graphs, γ is used akin to period for determining concurrent instances.

Figure 5A:
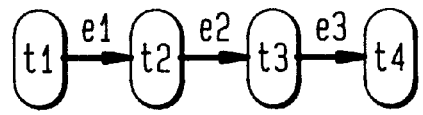
FIGS. 5($a$)–($c$) show exemplary task graph pipelining.
Figure 5B:
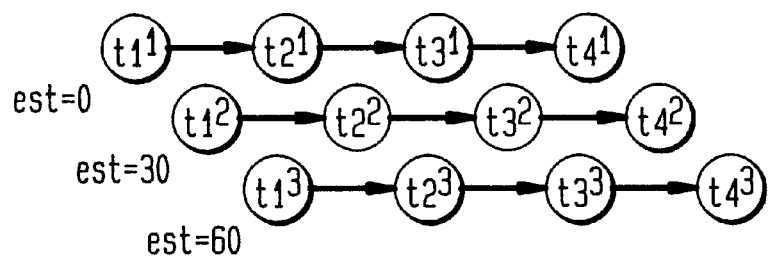
Figure 5C:
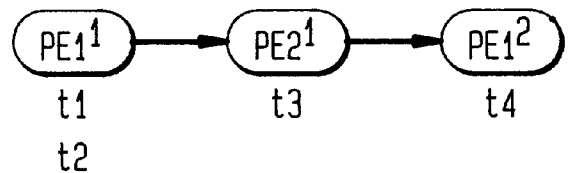

Concurrent instances of task graphs are allocated to the same set of PEs to achieve pipelining. For example, consider the aperiodic task graph, resource library, and execution/communication time vectors shown in FIG. 5(a). Since its deadline is 90 and minimum inter-instance time interval is 30, three concurrent instances of the task graph may be running, as shown in FIG. 5(b). These concurrent aperiodic task graphs could be allocated as shown in FIG. 5(c) to achieve a pipelined architecture ($PE1^1$ and $PE1^2$ are two instances of the PE library element PE 1).

Tasks that do not start at est=0 may have the execution interval of their last copy exceed the hyperperiod. The portion of the execution interval that exceeds the hyperperiod is termed as hyperperiod spill. In order to ensure that the resulting schedule is feasible and resources are not overused, the algorithm makes space for the required hyperperiod spill at the beginning of the hyperperiod (since the schedule derived for a hyperperiod is repeated for successive hyperperiods). Hence, for such tasks, the algorithm reassigns their priority level by adding the hyperperiod to it (the concept of priority level is described in Section 4.2). Doing this gives such tasks much higher priority than other tasks in the system, enabling them to find a suitable slot at the beginning of the next hyperperiod. This reassigned priority level is used during scheduling. If the required spill is still not available after the priority level reassignment (this could be due to competing tasks which either required a spill or must start at the beginning of the hyperperiod), the algorithm upgrades the allocation.

4.2 Task Clustering

Clustering involves grouping of tasks to reduce the complexity of allocation. The present clustering technique addresses the fact there may be multiple longest paths through the task graph and the length of the longest path changes after partial clustering. The algorithm uses the critical path task clustering method given in Reference (2). In order to cluster tasks, the algorithm first assigns deadline-based priority levels to tasks and edges using the procedure from Reference (2). The priority level of a task is an indication of the longest path from the task to a task with a specified deadline in terms of computation and communication costs as well as the deadline. In the beginning, when allocation is not defined, the algorithm sums up the maximum execution and communication times along the longest path and subtracts the deadline from the sum to determine the priority levels. However, priority levels are recomputed after each allocation as well as task clustering steps. In order to reduce the schedule length, the algorithm decreases the length of the longest path. This is done by forming a cluster of tasks along the current longest path. This makes the communication costs along the path zero. Then the process can be repeated for the longest path formed by the yet unclustered tasks, and so on. Experience from COSYN (see Reference (2)) shows that task clustering results in up to three-fold reduction in co-synthesis CPU time for medium-sized task graphs with less than 1% increase in system cost.

4.3 Cluster Allocation

Once the clusters are formed, they are allocated to PEs. The priority level of a cluster is defined as the maximum of the priority levels of the constituent tasks and incoming edges. Clusters are ordered based on decreasing priority levels. After the allocation of each cluster, the algorithm recalculates the priority level of each task and cluster. The algorithm picks the cluster with the highest priority level and creates an allocation array. This is an array of the possible allocations for a given cluster at that point in co-synthesis. It is formed considering preference vectors, upgrade of PEs, upgrade of links, addition of PEs and links, etc. Limiting the number of PEs and links that can be added at any step helps keep the allocation array size at manageable levels. The algorithm orders the allocations in the allocation array in the order of increasing value of dollar cost. Once the allocation array is formed, the inner loop of co-synthesis is used to evaluate the allocations from this array. During this loop, the algorithm picks the allocation with the least dollar cost and performs scheduling and allocation evaluation. If deadlines are met, the algorithm picks the next cluster, otherwise the algorithm repeats the process with another allocation from the allocation array.

4.4 Scheduling

To determine the order of scheduling, the algorithm prioritizes tasks and edges based on the decreasing order of their priority levels. If two tasks (edges) have equal priority levels then the algorithm schedules the task (edge) with the shorter execution (communication) time first. While scheduling communication edges, the scheduler considers the mode of communication (sequential or concurrent) supported by the link and the processor. Though preemptive scheduling is sometimes not desirable due to the overhead associated with it, it may be necessary to obtain an efficient architecture. The preemption overhead, $\xi$, is determined experimentally considering the operating system overhead. It includes context switching and any other processor-specific overheads. To minimize scheduling complexity, preemption of a higher priority task by a lower priority task is allowed only in the case when the higher priority task is a sink task which will not miss its deadline, in order to minimize the scheduling complexity. For each aperiodic task, as explained before, the algorithm positions the execution slots throughout the hyperperiod after scheduling the first execution slot. If the execution slot cannot be allocated at the required instant, the algorithm schedules it at the earliest possible time and repositions the remaining slots to ensure that the deadlines are always met.

4.5 Performance Estimation

The algorithm uses the finish-time estimation technique using a longest path algorithm from Reference (2) to estimate the finish times of all tasks with specified deadlines and check whether their deadlines are met. The scheduler provides accurate information on the start and finish times of the allocated tasks and edges. This, in turn, makes the present finish-time estimation method more accurate and minimizes false rejection of an allocation. The algorithm stores the start as well as the finish times of each task and edge based on its best-possible as well as the worst-possible allocation. When a task or edge gets allocated, its start times converge to one number, so do its finish times.

4.6 Allocation Evaluation

Each allocation is evaluated based on the total dollar cost which is the summation of dollar cost of constituent PEs and links. The algorithm picks the allocation that at least meets the deadline in the best case. If no such allocation exists, the algorithm picks an allocation for which the summation of the best-allocation based finish times of all tasks with specified deadlines (recall that a task graph can have more than one task with a specified deadline) in all task graphs is maximum. This generally leads to the least-expensive architecture since a larger finish time usually corresponds to a less expensive architecture (note that the algorithm can always upgrade the architecture at a later step, if necessary, to meet real-time constraints). If there are more than one allocation that meet this criterion, then, to break the tie, the algorithm chooses the allocation for which the summation of the worst-allocation based finish times of all tasks with deadlines is maximum.

5 Experimental Results

CASPER is implemented in C++. It was run on various Bell Laboratories telecom transport system task graphs. These are large task graphs representing real-life field applications. The execution times for the tasks in these graphs were either experimentally measured or estimated based on existing designs. The general-purpose processors in the resource library had the real-time operating system, pSOS+, running on them. The execution times included the operating system overhead. For results on these graphs, the PE library was assumed to contain Motorola microprocessors 68360, 68040, 68060 (each processor with and without a second-level cache), 11 ASICs, one XILINX 3195A FPGA, one ORCA 2T15 FPGA, and two optical transmitter and receiver modules. The link library was assumed to contain a 680X0 bus, a 1 Mb/s LAN, a 10 Mb/s LAN, a 6.176 Mb/s serial link supporting broadcast mode, and a 31 Mb/s serial link. Telecom embedded systems contain a mix of periodic and aperiodic task graphs. For the eight telecom examples considered next, on an average 30% of the tasks were aperiodic.

Table 1 shows the experimental results. The first major column in this table gives characteristics of the distributed architecture derived by CASPER employing the slack stealing (see Reference (31)) concept. In this case, hard aperiodic task graphs are allocated after the architecture for hard periodic task graphs is defined. Slacks from the schedules of the periodic task graphs are stolen to service aperiodic task graphs, and the architecture is upgraded when necessary. The CPU times are on Sparcstation 20 with 256 MB of DRAM. The second major column gives results for CASPER using RMS. See References (41)–(42). In this case, aperiodic and periodic task graphs are handled concurrently. For RMS, priority levels are assigned based on task graph periods, where task graphs with a shorter period receive higher priority. In case of an aperiodic task graph, its minimum inter-instance time interval is treated akin to the period for assigning the priority level. If two tasks (edges) have the same priority level, the algorithm schedules the task (edge) with the smaller execution (communication) time first. The third major column gives the results with CASPER employing the scheduler using deadline-based priority levels, and invoking concurrent co-synthesis of aperiodic and periodic task graphs.

CASPER realizes on an average (average of individual cost reductions) 22.9% architecture cost savings over the slack stealing algorithm and 29.4% over RMS.

The CASPER system that achieved the experimental results described above was based on an experimental software version having many debug statements. As such, even further improvements in CPU time could be achieved by optimizing the code for performance.

6 Conclusions

The present invention is directed to an efficient co-synthesis algorithm for synthesizing distributed embedded system architectures for hard real-time aperiodic and periodic task graphs. Experimental results for various large real-life telecom system examples are very encouraging. The experimental results have also demonstrated the efficacy of using the present scheduling technique in the co-synthesis algorithm as opposed to slack stealing or RMS. This is the first work to provide simultaneous support of periodic and aperiodic task graphs with hard deadlines during co-synthesis that provides a guarantee that the real-time constraints will always be met.

References (1) M. R. Garey and D. S. Johnson, Computers and Intractability: A Guide to the Theory of NP-Completeness, W. H. Freeman and Co., 1979.

(2) B. P. Dave, G. Lakshminarayana, and N. K. Jha, "COSYN: Hardware-software co-synthesis of distributed embedded systems," in Proc. Design Automation Conf., pp. 703–708, June 1997.

(3) R. K. Gupta, Hardware-Software Cosynthesis of Digital Systems, Ph.D. thesis, Dept. of Electrical Engg., Stanford University, 1994.

(4) R. Ernst, J. Henkel and T. Benner, "Hardware-software co-synthesis for microcontrollers," IEEE Design & Test of Computers, vol. 10, no. 4, December 1993.

(5) J. Henkel and R. Ernst, "A hardware/software partitioner using a dynamically determined granularity," in Proc. Design Automation Conf., pp. 691–696, June 1997.

(6) S. Bakshi and D. J. Gajski, "Hardware/software partitioning and pipelining," in Proc. Design Automation Conf., pp. 713–716, June 1997.

(7) F. Vahid, J. Cheng and D. D. Gajski, "A binary-constraint search algorithm for minimizing hardware during hardware/software partitioning," in Proc. European Design Automation Conf., pp. 214–219, September 1994.

(8) E. Barros, W. Rosenstiel and X. Xiong, "A method for partitioning UNITY language to hardware and software," in Proc. European Design Automation Conf., pp. 220–225, September 1994.

(9) A. Jantsch, et al., "Hardware/software partitioning and minimizing memory interface traffic," in Proc. European Design Automation Conf., pp. 226–231, September 1994.

(10) A. Kalavade and E. A. Lee, "A hardware-software codesign methodology for DSP applications," IEEE Design & Test of Computers, vol. 10, no. 3, pp. 16–28, September 1993.

(11) A. Kalavade and E. A. Lee, "A global criticality/local phase driven algorithm for constrained hardware/software partitioning problem," in Proc. Int. Wkshp. Hardware-Software Co-Design, pp. 42–48, September 1994.

(12) K. Buchenrieder and C. Veith, "A prototyping environment for control-oriented HW/SW systems using statecharts, activity charts and FPGA's," in Proc. European Design Automation Conf., pp. 60–65, September 1994.

(13) J. Buck, S. Ha, E. A. Lee, and D. G. Messerschmitt, "Ptolemy: A framework for simulating and prototyping heterogeneous systems," Int. J. Comp. Simulation, January 1994.

(14) S. Antoniazzi, A. Balboni, W. Fomaciari, and D. Sciuto, "A methodology for control dominated systems codesign," in Proc. Int. Wkshp. Hardware/Software Co-Design, pp. 2–9, September 1994.

(15) M. Chiodo, et al., "A formal specification model for hardware-software co-design," in Proc. Int. Wkshp. Hardware/Software Co-Design, September 1993.

(16) M. B. Srivastava and R. W. Brodersen, "SIERA: A unified framework for rapid-prototyping of system-level hardware and software," IEEE Trans. Computer-Aided Design, pp. 676–693, June 1995.

(17) F. Vahid, S. Narayan, and D. D. Gajski, "SpecCharts: A VHDL front-end for embedded systems," IEEE Trans. Computer-Aided Design, pp. 694–706, June 1995.

(18) M. Theibinger, P. Stravers, and H. Veit, "Castle: An interactive environment for HW-SW co-design," in Proc. Int. Wkshp. Hardware/Software Co-Design, pp. 203–210, September 1994.

(19) J. A. Rowson, "Hardware/software co-simulation," in Proc. Design Automation Conf., pp. 439–440, June 1994.

(20) W. Wolf, "Hardware-software co-design of embedded systems," Proc. IEEE, pp. 967–989, July 1994.

(21) S. Prakash and A. Parker, "SOS: Synthesis of application-specific heterogeneous multiprocessor systems," J. Parallel & Distributed Comput., vol. 16, pp. 338–351, December 1992.

(22) J. G. D'Ambrosio and X. Hu, "Configuration-level hardware/software partitioning for real-time systems," in Proc. Int. Wkshp. Hardware-Software Co-Design, pp. 34–41, September 1994.

(23) T.-Y. Yen and W. Wolf, "Communication synthesis for distributed embedded systems," in Proc. Int. Conf. Computer-Aided Design, November 1995.

(24) D. Kirovski and M. Potkonjak, "System-level synthesis of low-power hard real-time systems," in Proc. Design Automation Conf., pp. 697–702, June 1997.

(25) S. Srinivasan and N. K. Jha, "Hardware-software co-synthesis of fault-tolerant real-time distributed embedded systems," in Proc. European Design Automation Conf., pp. 334–339, September 1995.

(26) B. P. Dave and N. K. Jha, "COFTA: Hardware-software co-synthesis of heterogeneous distributed embedded system architectures for low overhead fault tolerance," in Proc. Int. Symp. Fault-Tolerant Computing, pp. 339–348, June 1997.

(27) K. Ramamritham and J. A. Stankovic, "Scheduling algorithms and operating systems support for real-time systems," Proc. IEEE, January 1994.

(28) J. Lehoczky and S. Ramos-Thuel, "An optimal algorithm for scheduling soft aperiodic tasks in fixed-priority preemptive systems," in Proc. Real-Time Systems Symp., pp. 110–123, December 1992.

(29) S. Ramos-Thuel and J. Lehoczky, "On-line scheduling of hard deadline aperiodic tasks in fixed-priority systems," in Proc. Real-Time Systems Symp., pp. 160–173, December 1993.

(30) R. I. Davis, K. W. Tindell, and A. Burns, "Scheduling slack time in fixed priority pre-emptive systems," in Proc. Real-Time Systems Symp., pp. 222–231, December 1993.

(31) B. Sprunt, J. Lehoczky, and L. Sha, "Exploiting unused periodic time for aperiodic service using the extended priority exchange algorithm," in Proc. Real-Time Systems Symp., pp. 160–173, December 1993.

(32) R. Davis and A. Burns, "Optimal priority assignment for aperiodic tasks with firm deadlines in fixed priority pre-emptive systems," Information Processing Letters, pp. 249–254, 1995.

(33) K. Jeffay, D. F. Stanat, and C. U. Martel, "On non-preemptive scheduling of periodic and sporadic tasks," in Proc. Real-Time Systems Symp., pp. 129–139, December 1991.

(34) S. Baruah et al., "On the competitiveness of on-line real-time task scheduling," in Proc. Real-Time Systems Symp., pp. 106–114, December 1991.

(35) C.-J. Hou and K. G. Shin, "Load sharing with consideration of future task arrivals in heterogeneous distributed real-time systems," in Proc. Real-Time Systems Symp., pp. 94–101, December 1991.

(36) W. Zhao, K. Ramamritham, and J. A. Stankovic, "Scheduling tasks with resource requirements in hard real-time systems," IEEE Trans. Software Engg., pp. 564–577, May 1987.

(37) K. Ramamritham, J. A. Stankovic, and P. Shiah, "Efficient scheduling algorithms for real-time multiprocessor systems," IEEE Trans. Parallel & Distributed Systems, pp. 184–194, April 1990.

(38) S. Cheng, J. A. Stankovic, and K. Ramamritham, "Dynamic scheduling of groups of tasks with precedence constraints in distributed hard real-time systems," in Proc. Real-Time Systems Symp., pp. 166–179, December 1986.

(39) K. S. Hong and J. Y.-T. Leung, "On-line scheduling of real-time tasks," in Proc. Real-Time Systems Symp., pp. 244–250, December 1988.

(40) B. Kao and H. Garcia-Molina, "Deadline assignment in a distributed soft real-time system," Tech. Rep., Stanford University, STAN-CS-92-1452, October 1992.

(41) L. Sha et al., "Generalized rate-monotonic scheduling theory: A framework for developing real-time systems," Proc. IEEE, January 1994.

(42) C. L. Liu and J. Layland, "Scheduling algorithms for multiprogramming in hard real-time environment," J. Amer. Computing Mach., vol. 20, pp. 46–61, 1973.

(43) E. Lawler and C. Martel, "Scheduling periodically occurring tasks on multiple processors," Information Processing Letters, vol. 12, Febuary 1981.

(44) S. Kim and J. Browne, "A general approach to mapping of parallel computations upon multiprocessor architectures," in Proc. Int. Conf. Parallel Processing, vol. 12, pp. 1–8, August 1988.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for designing the architecture of an embedded system, comprising:

(a) a pre-processing phase comprising the step of parsing one or more aperiodic task graphs, one or more system/task constraints, and a resource library for the embedded system; and (b) a synthesis phase, following the pre-processing phase, comprising the step of allocating one or more groups of one or more tasks in the aperiodic task graphs to one or more processing elements (PEs) in the resource library and allocating one or more edges in the aperiodic tasks graphs to one or more communication links in the resource library, based on performance evaluation of one or more possible allocations for each of the groups and edges in light of the system/task constraints, wherein the aperiodic task graphs have hard real-time constraints and deadlines for the aperiodic task graphs are always met.

2. The method of claim 1, wherein the pre-processing phase comprises the further step of parsing one or more periodic task graphs for the embedded system.

3. The method of claim 2, wherein, during the synthesis phase, the groups of one or more tasks in the aperiodic task graphs and one or more groups of one or more tasks in the periodic task graphs are allocated to PEs concurrently.

4. The method of claim 1, wherein the performance evaluation is based on results of scheduling the one or more possible allocations for each of the groups and edges.

5. The method of claim 4, wherein static scheduling is used.

6. The method of claim 5, wherein dynamic scheduling is used for soft aperiodic task graphs.

7. The method of claim 1, wherein sizes of execution slots are estimated, and the execution slots are allocated on PEs and communication links of the architecture to which constituent tasks and edges of the aperiodic task graphs are allocated such that the deadlines for the aperiodic task graphs are always met.

8. The method of claim 7, wherein the number of execution slots is minimized while still ensuring that the deadlines will always be met no matter when the aperiodic task graphs arrive for execution.

9. The method of claim 1, wherein, during the pre-processing phase, initial schedule lengths are derived for the aperiodic task graphs.

10. The method of claim 1, wherein: during the pre-processing phase, a hyperperiod is derived for the embedded system; and during the synthesis phase, for each of the groups, execution slots are positioned throughout the hyperperiod after scheduling a first execution slot.

11. The method of claim 10, wherein, if an execution slot cannot be allocated at a required instant, the execution slot is scheduled at the earliest possible time and any remaining execution slots are repositioned to ensure that deadlines are always met.

12. An embedded system having an architecture generated using the method of claim 1.

13. A method for designing the architecture of an embedded system, comprising:

(a) a pre-processing phase comprising the step of parsing one or more aperiodic task graphs, one or more system/task constraints, and a resource library for the embedded system; and (b) a synthesis phase, following the pre-processing phase, comprising the step of allocating one or more groups of one or more tasks in the aperiodic task graphs to one or more processing elements (PEs) in the resource library and allocating one or more edges in the aperiodic tasks graphs to one or more communication links in the resource library, based on performance evaluation of one or more possible allocations for each of the groups and edges in light of the system/task constraints, wherein, during the pre-processing phase, initial schedule lengths are derived for the aperiodic task graphs.

14. A method for designing the architecture of an embedded system, comprising:
  (a) a pre-processing phase comprising the step of parsing one or more aperiodic task graphs, one or more system/task constraints, and a resource library for the embedded system; and
  (b) a synthesis phase, following the pre-processing phase, comprising the step of allocating one or more groups of one or more tasks in the aperiodic task graphs to one or more processing elements (PEs) in the resource library and allocating one or more edges in the aperiodic tasks graphs to one or more communication links in the resource library, based on performance evaluation of one or more possible allocations for each of the groups and edges in light of the system/task constraints, wherein, if an execution slot cannot be allocated at a required instant, the execution slot is scheduled at the earliest possible time and any remaining execution slots are repositioned to ensure that deadlines are always met.

* * * * *